United States Patent
Chang et al.

(10) Patent No.: US 10,736,221 B2
(45) Date of Patent: Aug. 4, 2020

(54) CIRCUIT BOARD ASSEMBLY INSPECTION METHOD

(71) Applicant: UNIVERSAL GLOBAL TECHNOLOGY (KUNSHAN) CO., LTD., Qiandeng, Kunshan (CN)

(72) Inventors: Yi-Ming Chang, Caotun Township (TW); Shih-Nan Hsieh, Caotun Township (TW)

(73) Assignee: UNIVERSAL GLOBAL TECHNOLOGY (KUNSHAN) CO., LTD, Kunshan, Jiangsu Province (CN)

( * ) Notice: Subject to any disclaimer, the term of this patent is extended or adjusted under 35 U.S.C. 154(b) by 0 days.

(21) Appl. No.: 15/960,173

(22) Filed: Apr. 23, 2018

(65) Prior Publication Data

US 2019/0254173 A1    Aug. 15, 2019

(30) Foreign Application Priority Data

Feb. 9, 2018   (CN) .......................... 2018 1 0132447

(51) Int. Cl.
  *B23K 1/00*     (2006.01)
  *H05K 3/34*     (2006.01)
  (Continued)

(52) U.S. Cl.
  CPC ......... *H05K 3/3442* (2013.01); *B23K 1/0016* (2013.01); *B23K 31/12* (2013.01);
  (Continued)

(58) Field of Classification Search
  CPC .... H05K 3/3442; H05K 3/3494; H05K 3/225; H05K 2203/162; H05K 2203/16; B23K 1/0016; B23K 2101/36–42; B23K 31/12
  (Continued)

(56) References Cited

U.S. PATENT DOCUMENTS 5,012,502 A  *  4/1991  Battin .................... B23K 31/12
                                                      228/103
6,028,673 A  *  2/2000  Nagasaki ............. B23K 3/0623
                                                      356/608
(Continued)

FOREIGN PATENT DOCUMENTS

EP      3070431 A1 *  9/2016 .......... G01N 21/956
JP  2007033048 A  *  2/2007 ............. B23K 31/12
(Continued)

*Primary Examiner* — Kiley S Stoner
(74) *Attorney, Agent, or Firm* — Muncy, Geissler, Olds & Lowe, P.C.

(57) ABSTRACT

A circuit board assembly inspection method includes the following steps: measuring a geometrical characteristic value of a solder layer before soldering an electronic component to a circuit board and comparing the geometric characteristic value with a predetermined value and defining the grad of the solder layer according to a comparing result of the comparing step and performing a defective product process to the circuit board having an extremely bad solder layer, measuring a quality characteristic value of a solder joint layer after soldering the electronic component to the circuit board and comparing the quality characteristic value with a predetermined quality parameter value and then defining the grade of the solder joint layer according to a comparing result of the comparing step, manually inspecting the circuit board assembly having both an medium-grade solder layer a the poor solder joint layer.

7 Claims, 4 Drawing Sheets

(51) Int. Cl.
  *H05K 3/22* (2006.01)
  *B23K 31/12* (2006.01)

(52) U.S. Cl.
  CPC ............ *H05K 3/225* (2013.01); *H05K 3/3494* (2013.01); *H05K 2203/16* (2013.01); *H05K 2203/162* (2013.01)

(58) Field of Classification Search
  USPC .............. 228/102–105, 8–12, 179.1–180.22
  See application file for complete search history.

(56) References Cited

U.S. PATENT DOCUMENTS

| | | | | |
|---|---|---|---|---|
| 6,607,117 | B1* | 8/2003 | Kang | B23K 1/0016 228/103 |
| 8,851,356 | B1* | 10/2014 | Holec | H05K 1/189 228/103 |
| 2003/0042289 | A1* | 3/2003 | Negishi | B23K 1/012 228/103 |
| 2004/0124228 | A1* | 7/2004 | Chang | B23K 31/12 228/103 |
| 2004/0218808 | A1* | 11/2004 | Prince | B23K 3/08 382/150 |
| 2006/0000872 | A1* | 1/2006 | Nakagawa | H05K 13/0817 228/56.5 |
| 2006/0071052 | A1* | 4/2006 | Conlon | G01N 21/6456 228/103 |
| 2006/0086773 | A1* | 4/2006 | Sanftleben | G01N 21/95684 228/103 |
| 2007/0017959 | A1* | 1/2007 | Nakagawa | B23K 31/12 228/103 |
| 2008/0197170 | A1* | 8/2008 | Prince | G01N 21/8806 228/103 |
| 2010/0021050 | A1* | 1/2010 | Kakuda | B23K 1/0016 382/150 |
| 2011/0169160 | A1* | 7/2011 | Greer | B23K 1/0016 257/737 |
| 2015/0289426 | A1* | 10/2015 | Mantani | H05K 13/0465 228/9 |
| 2015/0298233 | A1* | 10/2015 | Dreikorn | B23K 1/0016 228/102 |
| 2016/0284662 | A1* | 9/2016 | Wada | H05K 3/0008 |
| 2016/0295757 | A1* | 10/2016 | Itoh | H05K 13/08 |
| 2016/0320314 | A1* | 11/2016 | Suzuki | G01N 21/956 |
| 2018/0049356 | A1* | 2/2018 | Mori | B23K 1/0016 |

FOREIGN PATENT DOCUMENTS

| | | | | |
|---|---|---|---|---|
| JP | 2012145483 A | * | 8/2012 | ............ G01B 11/24 |
| JP | 2012145484 A | * | 8/2012 | ............ G01B 11/24 |
| TW | 201714515 A | | 4/2017 | |
| WO | WO-2012096003 A1 | * | 7/2012 | ............ G01B 11/24 |
| WO | WO-2012096004 A1 | * | 7/2012 | ............ G01B 11/24 |

* cited by examiner

CIRCUIT BOARD ASSEMBLY INSPECTION METHOD

BACKGROUND OF THE INVENTION

1. Field of the Invention

The present invention relates to an inspection method for printed circuit board and more particularly, to an inspection method for circuit board assembly based on specific conditions, which can reduce the amount of the circuit board assembly needed to be manually inspected.

2. Description of the Related Art

In a front-end process for manufacturing a circuit board assembly (including a circuit board and multiple electronic components connected to the circuit board) using surface mount technology (SMT), to inspect any defect (such as short circuit, excess tin, insufficient tin, tombstone, solder skip, faulty parts, etc.) between each electronic component and the circuit board is very important. Through the above inspection, each electronic component on the circuit board can be ensured to be correctly and firmly soldered to the circuit board.

In general, among the various known inspection technologies, the use of non-contact type automated optical inspection (AOI) technology can reduce the cost of manual inspection and human error and it can effectively improve the inspection speed. However, with the demand for the market to miniaturize the circuit board assembly, the automatic optical detection technology has been severely challenged, especially as the size of the electronic component has become smaller and the layout on the circuit board has become denser. What is more serious is that the automatic optical inspection technology is easily affected by factors such as the optical resolution, the configuration of the ambient light source and the arrangement of inspection mechanism and it may cause misjudgment to give off a false alarm. When the above misjudgment occurs, usually it is needed to assign an operator on the assembly line to manually identify the circuit board assembly that has been misjudged to avoid excessive waste costs and to improve the production yield. However, if there are too many circuit board assembly are misjudged, it will not only increase more personnel costs for manual inspections, but also delay the overall production time.

It is known that in the published documents, Publication No. TW 201714515A describes an inspection apparatus and method for soldering joints. Referring to the FIG. 2 of the drawings of the above patent, in the provided inspection method, in step S120, it is first checked whether at least one of the measured geometric parameters of the soldering surface 14 wetted by the solder 15 is within a predetermined range. After that, in step S170, the component 16 to be soldered is placed on the printed circuit board, and in step S180, the reflow process is performed. Thereafter, in step S300, an automatic soldering point check is performed to inspect at least one quality characteristic of the soldering joints. In step 310, the above quality characteristic is compared with a predetermined threshold, and the soldering point is then defined as a good soldering joint or a poor soldering point. If it is classified as a good soldering joint, the printed circuit board 18 having the good soldering joint will be transferred to the subsequent production process 9A in step S500. On the contrary, if at least one soldering point of the printed circuit board 18 is evaluated as a poor holding point, then in step S410, the printed circuit board 18 having the poor soldering joint will be further manually inspected to determine whether the printed circuit board 18 is to be transferred to the subsequent production process 9A, or to the reprocessing process or defective product process.

However, in the above-mentioned patent, if the amount of printed circuit boards 18 that are misjudged in step S300 and step S310 are too large, it will also lead to an increase in the cost of manual inspection and the problem of prolonged overall production time. Therefore, aforesaid known inspection method is obviously costly and relatively inefficient and still needs improvement.

SUMMARY OF THE INVENTION

The present invention has been accomplished under the circumstances in view. In order to overcome the problems of conventional inspection techniques, the invention provides an innovative circuit board assembly inspection method for inspecting at least one circuit board assembly. The at least one circuit board assembly each comprises a circuit board and at least one electronic component. The circuit board comprises at least one solderable area, and a solder layer located on each solderable area. Each electronic component comprises at least one pin capable of being soldered to the circuit board through the solder layer so that a solder joint layer which is made from the solder layer is formed between the pin and the circuit board. The circuit board assembly inspection method comprises the steps of measuring a geometrical characteristic value of at least one geometric parameter of the solder layer before soldering the at least one electronic component to the circuit board, comparing the geometric characteristic value with a predetermined geometric parameter value, defining the solder layer to be an good-grade solder layer, a medium-grade solder layer, an inferior-grade solder layer or an extremely bad solder layer according to a comparing result of the comparing step, performing a defective product process on the circuit board having the extremely bad solder layer; measuring a quality characteristic value of at least one quality parameter of the solder joint layer after soldering the at least one electronic components to the circuit board to form the at least one circuit board assembly, comparing the quality characteristic value with a predetermined quality parameter value, defining the solder joint layer as a good solder joint layer or a poor solder joint layer according to a comparing result of the comparing step; manually inspecting the at least one circuit board assembly having both the medium-grade solder layer and the poor solder joint layer.

The beneficial effects of embodiment of the present invention are as follows: the embodiment applies the two data of geometrical characteristic value and quality characteristic value to do comprehensive comparison and analysis. Therefore, when the inspection method of the present embodiment is used for inspection, only the circuit board assembly having the poor solder joint layer and the medium-grade solder layer are needed to be inspected manually. Therefore, the quantity of the circuit board assemblies to be manually inspected can be greatly reduced, effectively lowering the possibility of false alarm, effectively improving the inspection efficiency, reducing the personnel cost for manual inspection and shortening the overall circuit board assembly production time.

Preferably, the geometric parameter is one or a combination of a length of the solder layer, a width of the solder layer, a height of the solder layer, an area of the solder layer and a volume of the older layer. Similarly, the quality parameter is one or a combination of a projected length of the solder joint layer on the circuit board, a projected width of the solder joint layer on the circuit board, a maximum height of the solder joint layer, a projected area of the solder joint layer on the circuit board and a shifting distance of the solder joint layer.

Preferably, the step of measuring a quality characteristic value of at least one quality parameter of said solder joint layer is performed by using a solder paste inspector (SPI) to measure the at least one geometric parameter of the solder layer and by using an automated optical inspector (AOI) to measure the at least one quality parameter of the solder joint layer. Therefore, the inspection method of the present embodiment can use the known machines originally used for inspection and can further promote the inspection efficiency and increase the overall production yield with a small amount of additional cost.

In one aspect, the circuit board assembly inspection method further comprises the step of: using a machine to determine the at least one circuit board assembly having the good-grade solder layer and the good solder joint layer and performing a back-end process to the circuit board assembly having the good-grade solder layer and the good solder joint layer. Through the machine, the determination of whether the circuit board assembly to be inspected passes the inspection can be quickly done, and the circuit board assembly that passed the inspection can be used for a subsequent process.

In another aspect, the circuit board assembly inspection method further comprises the step of: performing a defective product process to the circuit board assembly having the inferior-grade solder layer and the poor solder joint layer to recycle and reuse the circuit board assembly that did not pass the inspection.

In another aspect, the circuit board assembly inspection method further comprises the step of: performing a back-end process to the circuit board device having the good-grade solder layer and the poor solder joint layer. Through the machine to quickly determine the circuit board assembly to be inspected, it allows the circuit board assembly that meets the abovementioned conditions to pass the inspection directly, reducing the quantity of the circuit board assembly needed to be manually inspected.

Preferably, the at least one pin of each electronic component is soldered to the circuit board by placing the at least one pin of each electronic component on the solder layer and then performing a reflow process to form the at least one circuit board assembly. However, the present invention is not limited to the above bonding method, other connection measures can be applied to achieve connection between the electronic components and the circuit board.

Other advantages and features of the present invention will be fully understood by reference to the following specification in conjunction with the accompanying drawings, in which like reference signs denote like components of structure.

DETAILED DESCRIPTION OF THE INVENTION

In the terms used in the following embodiments, "circuit board" refers to a printed circuit board (PCB), which is a carrier of electronic components but does not contain electronic components; "circuit board assembly" refers to a collection of both a circuit board and electronic components soldered to the circuit board; "solder layer" refers to a layer of solder disposed on a solderable area of the circuit board prior to soldering the electronic components to the circuit board, and the solder layer is usually a solder paste; "solder joint layer" refers to a connecting structure formed between the pins of the electronic component and the circuit board when the pins of the electronic component are soldered to the circuit board. The connecting structure is made from the solder layer. Thus the composition of the connecting structure is solder. The "solder joint layer" may also be referred to as "solder joint" or "soldering point," but to prevent the term "solder joint" from being misunderstood as a point structure having no volume in space, in the following embodiments, the connecting structure formed between the pins of the electronic component and the circuit board is called "solder joint layer".

Figure 1:
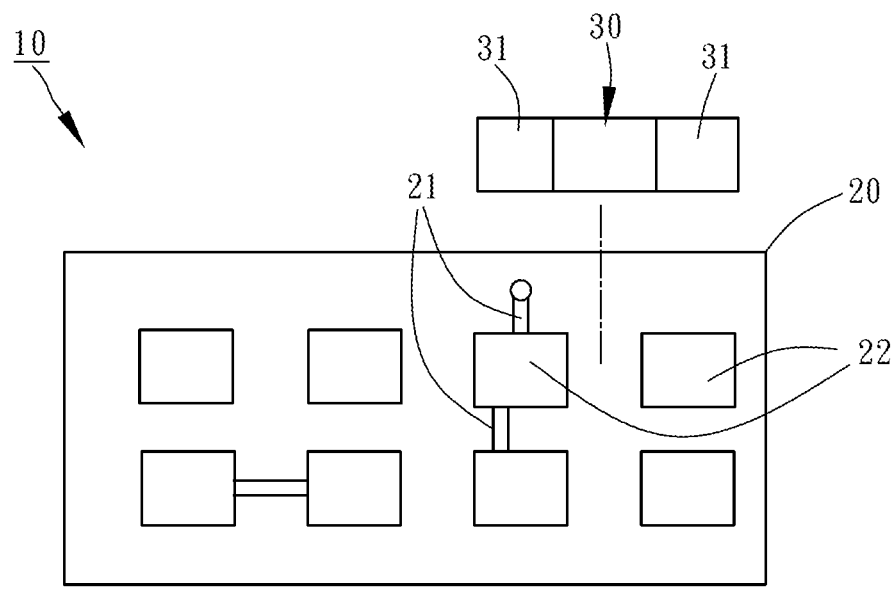
FIG. 1 is a schematic drawing illustrating the configuration of a circuit board and an electronic component in accordance with an exemplary embodiment of the present invention before soldering the electronic component to the circuit board.
Figure 2:
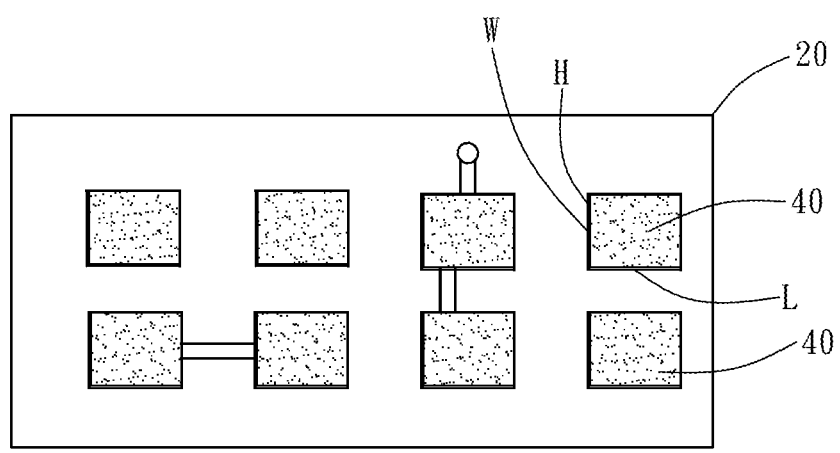
FIG. 2 is a schematic drawing of the circuit board, illustrating a layer of solder paste covered on each solderable area.
Figure 3:
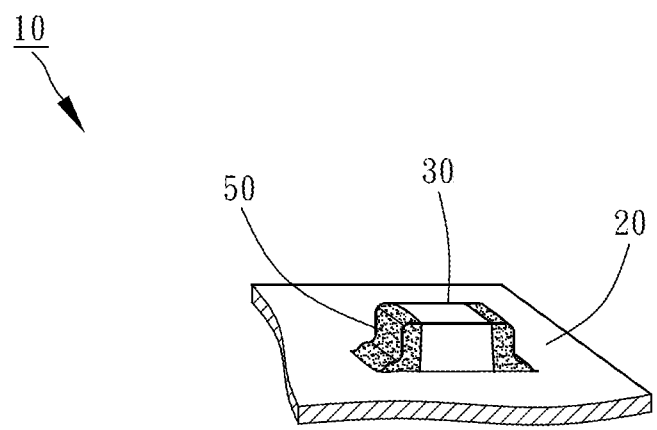
FIG. 3 is a schematic sectional elevation of a part of the circuit board, illustrating the configuration of a solder joint layer.

Referring to FIG. 1, according to an exemplary embodiment of the invention, a circuit board assembly inspection method is provided for inspecting a plurality of the circuit board assemblies 10 (the quantity of the circuit board assemblies 10 and the areas to be tested are usually very large). The circuit board assemblies 10 to be tested have the same structure, each comprising a circuit board 20 and a plurality of electronic components 30. The circuit board 20 is provided with a layout 21 containing some solderable areas 22. For convenience of explanation of the following embodiments, the following content describes only the case that one pin 31 of an electronic component 30 is soldered to a solderable area 22 of the circuit board 20, and so on the pins 31 or other solderable areas 22 of the other electronic component 30. Each solderable area 22 is provided with a solder layer 40 (as shown in FIG. 2), so that the pin 31 of the electronic component 30 can be soldered to the circuit board 20 through the abovementioned solder layer 40, and a solder joint layer 50 can be formed between the pin 31 of the electronic component 30 and the circuit board 20 (as shown in FIG. 3). The electronic component 30 may be, for example, an integrated circuit or a connector.

In the present exemplary embodiment, the circuit board assembly inspection method includes the following steps. Please refer to FIG. 1 to FIG. 5, Steps S1 to S5 are performed before the electronic component 30 is soldered to the circuit board 20, and steps S8 to S15 are performed after the electronic component 30 is soldered to the circuit board 20.

Step S1: Preparing a circuit board 20 and an electronic component 30. The circuit board 20 is provided with a layout which contains 21 a plurality of solderable areas 22. The solderable areas 22 are exposed to the outside; two ends of the electronic component 30 are respectively provided with a pin 31.

After the Step S1, perform Step S2: Using a solder printer 71 (solder printer) to print a solder layer 40 on the solderable area 22 (see FIG. 2). In this embodiment, the solder layer 40 is essentially a layer of solder paste.

Figure 4:
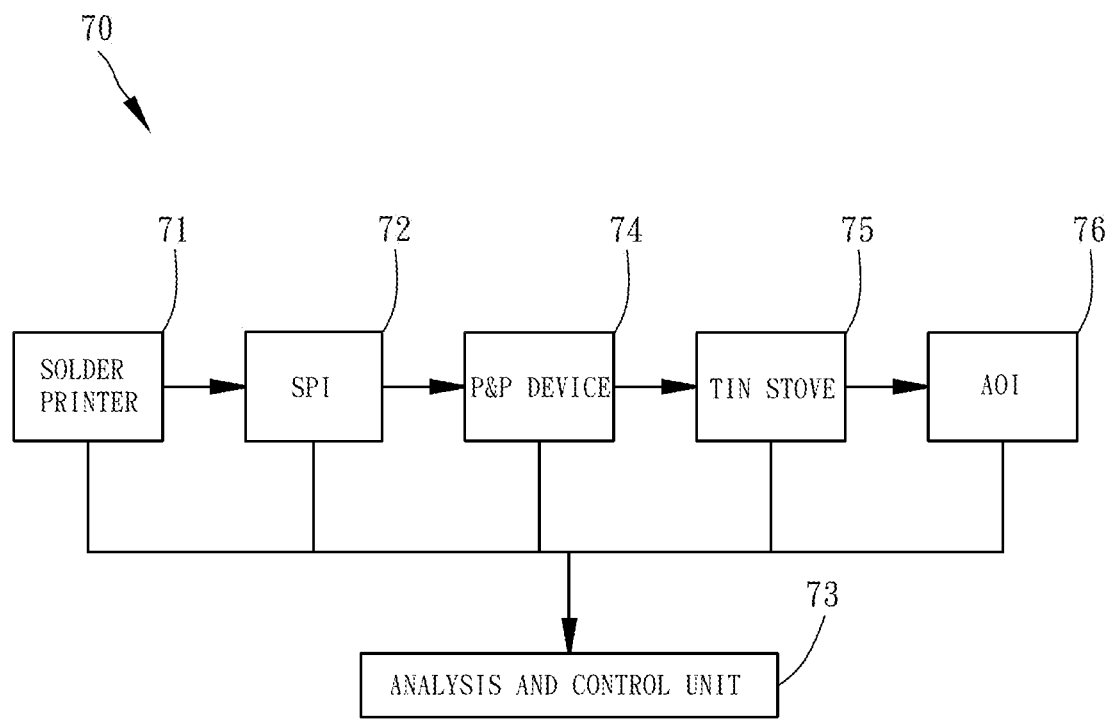
FIG. 4 is a block diagram of an inspection system in accordance with the exemplary embodiment of the present invention.
Figure 5:
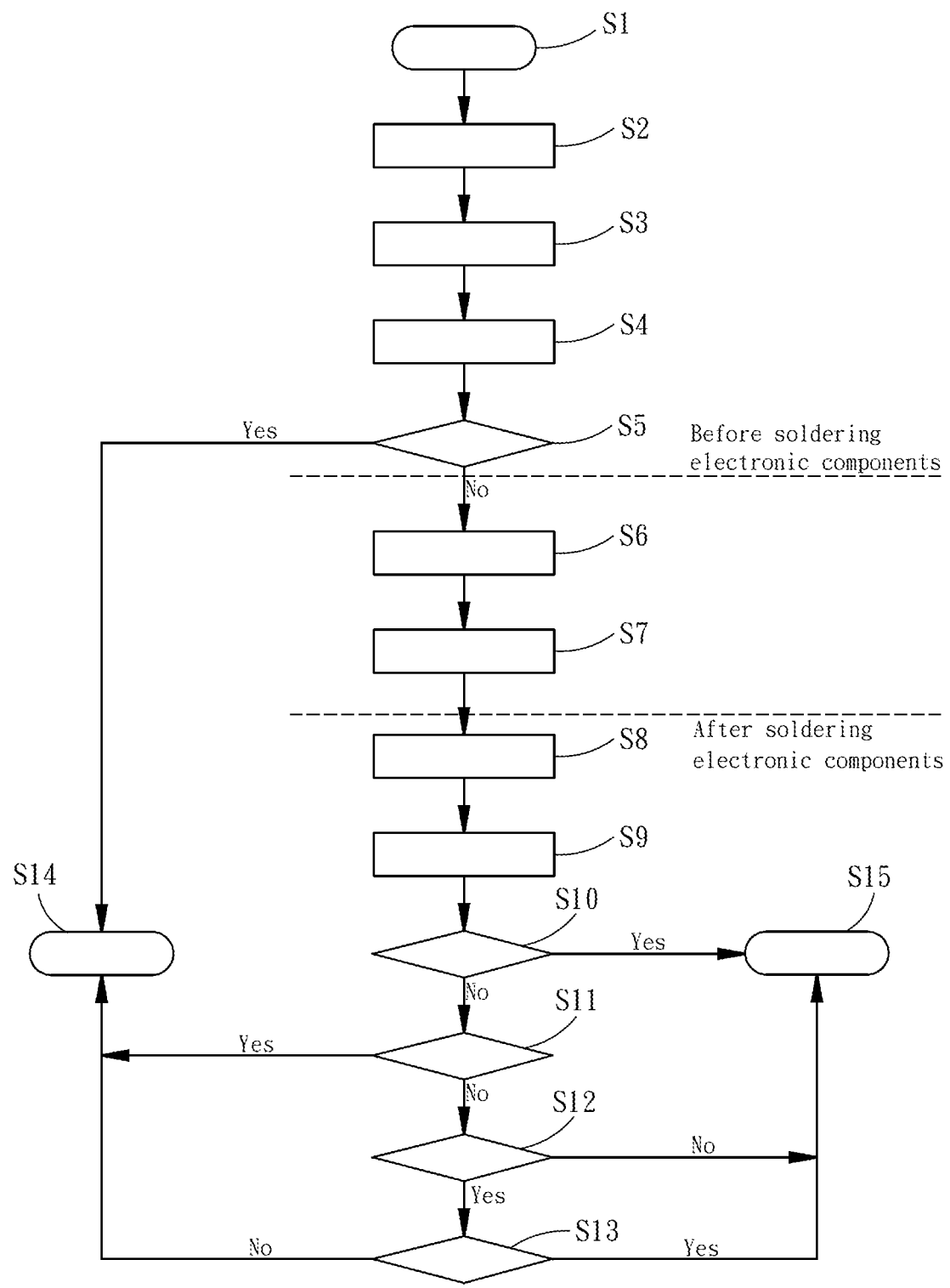
FIG. 5 is a flow chart of the circuit board assembly inspection method of the exemplary embodiment of the present invention.

Please refer in particular to the block diagram of an inspection system 70 shown in FIG. 4 and the flowchart shown in FIG. 5. After the Step S2, perform Step S3: Using a solder paste inspector (SPI) 72 to detect and measure geometrical characteristic values of various geometric parameters of the printed solder layer 40. Specifically, the image of the solder layer 40 is photographed through a plurality of lenses of the solder paste inspector 72, and the geometrical characteristic values of the geometric parameters to be analyzed is obtained from the photographed image. The geometric parameters may be one or multiple of a length L of the solder layer 40 (as shown in FIG. 2), a width W of the solder layer 40, a height H of the solder layer 40, an area of the solder layer 40 and a volume of the solder layer 40. After the solder paste inspector 72 obtains the geometrical characteristic values, it transmits the geometrical characteristic values to an analysis and control unit 73. In the present embodiment, the analysis and control unit 73 is essentially a host that can perform general basic arithmetic functions, and the host is installed with appropriate software to analyze various data transmitted to the host.

After the Step S3, perform Step S4: After the analysis and control unit 73 obtains the geometrical characteristic values of various geometric parameters, the analysis and control unit 73 compares each geometric characteristics value with a corresponding one of the predetermined geometric parameter value. The comparing method may be, for example, subtracting the geometric characteristics value from the predetermined geometric parameter value, and calculating the ratio obtained by dividing the subtracted value by the predetermined geometric parameter value. The predetermined geometric parameter reference value may be, for example, a length PL of the solderable area 22 (see FIG. 6), a width PW of the solderable area 22 or a height of the solder paste printed by the solder printer 71. The analysis and control unit 73 will establish an algorithm based on the abovementioned comparing result and define the solder layer 40 according to the algorithm as good-grade solder layer, medium-grade solder layer, inferior-grade solder layer or extremely bad solder layer.

Figure 6:
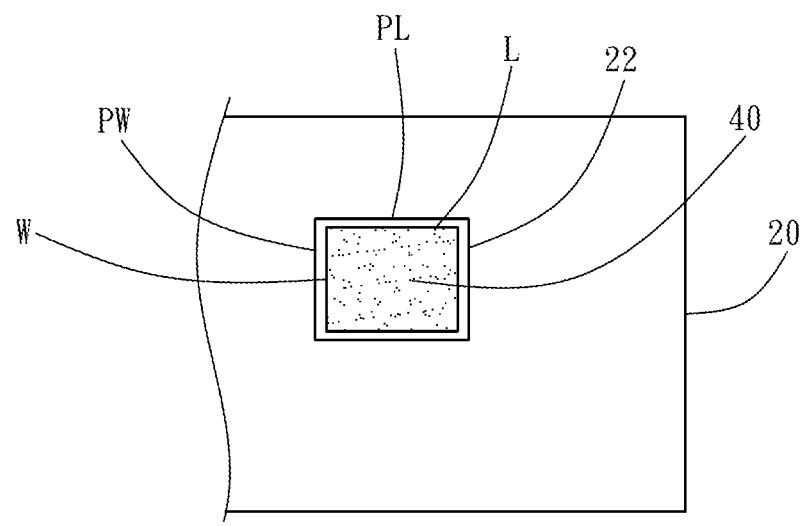
FIG. 6 is a schematic drawing of a solder layer, illustrating the arrangement of the solder layer.

For example, if the length of the solder layer 40 and the width of the solder layer 40 are used as the geometric parameters, after the geometrical characteristic values of the geometric parameters are subtracted from the predetermined geometric parameter values, the subtracted value is divided by the predetermined geometric parameter value for constructing the algorithm for defining the grade of the solder layer 40, for example, for a geometric parameter of the length of the solder layer 40, a solder layer 40 with a length ratio $$\left(\frac{|L-PL|}{PL}\right)$$

of 1% is regarded to have a score of 100 points, a length ratio between 1% to 3% is regarded to have 80 points, a length ratio between 3% to 5% is regarded to have 60 points, and a length ratio exceeds 5% is regarded to have zero points (see FIG. 6). Further, the same calculation is made for the geometric parameters as a width ratio $$\left(\frac{|W-PW|}{PW}\right)$$

of the solder layer 40. The algorithm will calculate the minimum of two points (from the length ratio and width ratio of the solder layer 40). If the calculation result of the algorithm is 100 points, the solder layer 40 is defined as the good-grade solder layer. If the calculation result is 80 points, it is defined as the medium-grade solder layer. If the calculation result is 60 points, it is defined as an inferior-grade solder layer, and the score of zero point is defined as the extremely bad solder layer.

It should be noted that the comparison between the geometrical characteristic value and the predetermined geometric parameter value and the abovementioned algorithm may be adjusted according to requirements, e.g. adjusting the weight of different geometric parameters or changing the calculation function of the algorithm, or adding the following conditions: once a short circuit phenomenon is found, the solder layer 40 is evaluated as an extremely bad solder layer. Therefore, the comparison should not be limited to this embodiment.

After the Step S4, perform Step S5: determining whether the solder layer 40 of the circuit board 20 is defined as an extremely bad solder layer. If the determination result is YES, the process proceeds to step S14: performing a defective product process to the circuit board 20 having the extremely bad solder layer for reprocessing or disposal. If the determination result is NO, the process proceeds to Step S6.

In the Step S6: using a pick-and-place device 74 (P&P device) to place the electronic component 30 on the solderable area 22 of the circuit board 20 with the pin 31 of the electronic component 30 attached onto the top side of the respective solder layer 40 for enabling the electronic component 30 to be soldered to the circuit board 20.

After the Step S6, perform Step S7: Delivering the circuit board 20 with the electronic component 30 to a tin stove 75 to perform a reflow process, enabling the pin 31 of the electronic component 30 to be soldered to the circuit board 20 through the melted solder layer 40, so that a solder joint layer 50 can be formed between the pin 31 and the circuit board 20, and the circuit board 20 and the electronic component 30 can be connected to form a circuit board assembly 10. There are many ways of bonding the electronic component 30 and the circuit board 20, and it should not be limited to the Step S6 and the Step S7.

Figure 7:
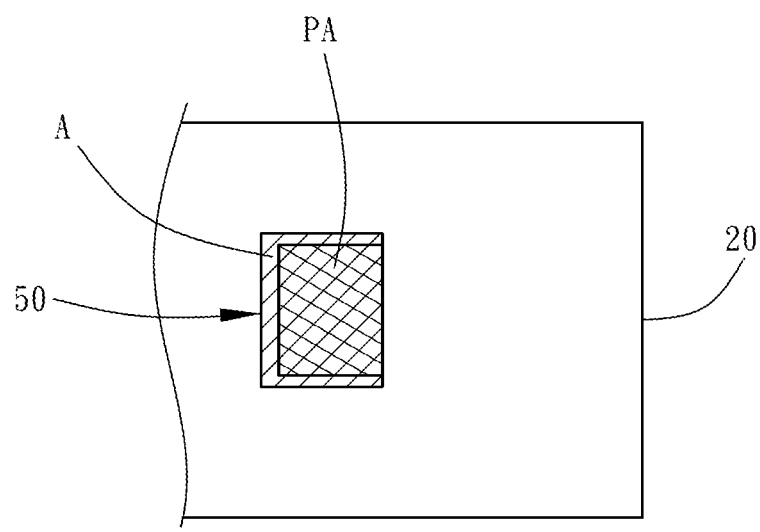
FIG. 7 is a schematic drawing illustrating a projected area of the solder joint layer on the circuit board.

After the Step S7, perform Step S8: Using an automated optical inspection machine 76 to inspect and measure the quality characteristic value of each quality parameter of the solder joint layer 50. More specifically, using lenses of the automated optical inspection machine 76 to aim at the solder joint layer 50 and to take an image of the solder joint layer 50 so as to obtain the quality characteristic value of the quality parameter to be subsequently analyzed. The quality parameter may be one or a combination of a length of the projected area of the solder joint layer 50 on the circuit board 20, a width of the projected area of the solder joint layer 50 on the circuit board 20, a maximum height of the solder joint layer 50, a projected area A of the solder joint layer 50 on the circuit board 20 (see FIG. 7) and a shifting distance of the solder joint layer 50. After obtaining the quality characteristic value, the automated optical inspection machine 76 transmits the quality characteristic value to the analysis and control unit 73.

After the Step S8, perform Step S9: The analysis and control unit 73 comparing each quality characteristic value with one respective predetermined quality parameter value, and defining the solder joint layer 50 as a good solder joint layer or a poor solder joint layer according to the comparison result.

For instance, if the projected area of the solder joint layer 50 on the circuit board 20 is used as a quality parameter, after the quality characteristic value of the quality parameter (the projected area A of the solder joint layer 50 after soldering) is subtracted from the predetermined quality parameter value (such as a predetermined projected area PA of the solder joint layer 50), the value obtained from the subtraction is divided by the quality parameter value to obtain a ratio $$\left(\frac{|A - PA|}{PA}\right)$$

for defining the solder joint layer 50. For example, the solder joint layer 50 is defined as the good solder joint layer if the ratio is within 5%, or as the poor solder joint layer if the ratio is over 5%.

Similarly, the comparison between the quality characteristic value and the predetermined quality parameter value may also be adjusted according to requirements, and therefore the comparison should not be limited to this embodiment.

After the Step S9, perform Step S10: Determining whether the solder joint layer 50 of the circuit board assembly 10 is defined as the good solder joint layer. If the determination result is YES, that is, the circuit board assembly 10 has a good solder joint layer and the good-grade solder layer, thus, the circuit board assembly 10 is determined to pass the inspection and the process proceeds to Step S15 to perform a back-end process for this circuit board assembly 10, for example, to perform a function test to the circuit board assembly 10. If the determination result is NO, enable the automated optical inspection machine 76 to give off a warning signal and then the process proceeds to Step S11.

In the Step S11: At this time, the circuit board assembly 10 should have a solder joint layer that is defined as the poor solder joint layer, and a solder layer that is defined as the good-grade solder layer, medium-grade solder layer or inferior-grade solder layer. In the Step S11, determining whether the solder layer 40 of the circuit board assembly 10 is defined as the poor solder layer. If the determination result is YES, the process proceeds to Step S14: performing a defective product process to the circuit board assembly 10 having the inferior-grade solder layer and the poor solder joint layer; if the determination result is NO, the process proceeds to Step S12.

In the Step S12: At this time, the circuit board assembly 10 should have a solder joint layer that is defined as a poor solder joint layer, and a solder layer that is defined as a good-grade solder layer or medium-grade solder layer. In the Step S12, determine whether the solder layer 40 of the circuit board assembly 10 is defined as a medium-grade solder layer. If the determination result is YES, the process proceeds to Step S13 to manually inspect the circuit board assembly 10; if the determination result is NO, the process proceeds to Step S15, the circuit board assembly 10 is determined to pass the inspection and to perform the back-end process for this circuit board assembly 10.

More specifically, in the Step S13, only the circuit board assembly 10 with the poor soldering layer and the medium soldering layer is left. Manually through visual inspections to determine whether the soldering condition between the pin 31 and the circuit board 20 passes the inspection. If the soldering condition passes the inspection, the process proceeds to Step S15; if the soldering condition does not pass the inspection, the process proceeds to Step S14.

This embodiment applies the two data of the geometrical characteristic value and quality characteristic value to do comprehensive comparison and analysis. Therefore, when the inspection method of the present embodiment is used, only the circuit board assembly 10 having the poor solder joint layer and the medium-grade solder layer is needed to be inspected manually, but not to perform a manual inspection as long as the automated optical inspection machine 76 gives off a warning signal. Therefore, the quantity of the circuit board assembly 10 needed to be manually inspected can be greatly reduced, effectively improving the inspection efficiency, reducing the personnel cost for manual inspection and shortening the overall circuit board assembly 10 production time. It should be noted that the problem to be solved in the present embodiment mainly occurs when a large number of circuit board assemblies 10 are preliminary inspected by machine, and the present embodiment uses the abovementioned data to do comprehensive comparison and analysis and to further determine which circuit board assembly 10 requires a subsequent manual inspection. The determining method is quite systematic and scientific and can effectively improve the development of inspection efficiency in the field of inspection technology. These are all the main points of the present embodiment.

At final, upon the actual calculation of the yield, if the inspection method of the present invention is used, the yield of the manufacturing process can be further promoted.

What is claimed is:

1. A circuit board assembly inspection method for inspecting at least one circuit board assembly, said at least one circuit board assembly each comprising a circuit board and at least one electronic component, said circuit board comprising at least one solderable area and a solder layer located on each said solderable area, each said electronic component comprising at least one pin capable of being soldered to said circuit board through said solder layer so that a solder joint layer which is made from said solder layer is formed between said pin and said circuit board, the circuit board assembly inspection method comprising the steps of:

measuring a geometrical characteristic value of at least one geometric parameter of said solder layer before soldering said at least one electronic component to said circuit board, comparing said geometric characteristic value with a predetermined geometric parameter value, defining said solder layer to be a good-grade solder layer, a medium-grade solder layer, an inferior-grade solder layer or an extremely bad solder layer according to a comparing result of the comparing step, performing a defective product process to said circuit board having said extremely bad solder layer, wherein said geometric parameter includes a length (L) and a width (W) of said solder layer, said predetermined geometric parameter value includes a length (PL) and a width (PW) of said solderable area; wherein the solder layer with a length ratio $$\left(\frac{|L-PL|}{PL}\right)$$

of 1% is regarded to have a score of 100 points, a length ratio between 1% to 3% is regarded to have 80 points, a length ratio between 3% to 5% is regarded to have 60 points, and a length ratio exceeds 5% is regarded to have zero points, the solder layer with a width ratio $$\left(\frac{|W-PW|}{PW}\right)$$

of 1% is regarded to have a score of 100 points, a width ratio between 1% to 3% is regarded to have 80 points, a width ratio between 3% to 5% is regarded to have 60 points, and a width ratio exceeds 5% is regarded to have zero points; wherein the solder layer is respectively defined as the good-grade solder layer, the medium-grade solder layer, the inferior-grade solder layer and the extremely bad solder layer, when the minimum of the length ratio and the width ratio is 100 points, 80 points, 60 point, and zero point;

measuring a quality characteristic value of at least one quality parameter of said solder joint layer after soldering said at least one electronic components to said circuit board to form said at least one circuit board assembly, comparing the quality characteristic value with a predetermined quality parameter value, defining said solder joint layer as a good solder joint layer or a poor solder joint layer according to a comparing result of the comparing step, wherein said quality parameter is a projected area (A) of the solder joint layer, said predetermined quality parameter value is a predetermined projected area (PA) of the solder joint layer, a ratio $$\left(\frac{|A-PA|}{PA}\right)$$

is used for defining the solder joint layer, the solder joint layer 50 is defined as the good solder joint layer if the ratio is within 5%, or as the poor solder joint layer if the ratio is over 5%; and manually inspecting the said at least one circuit board assembly having both the said medium-grade solder layer and the said poor solder joint layer.

2. The circuit board assembly inspection method as claimed in claim 1, further comprising the step of: establishing an algorithm according to the comparing result between said quality characteristic value and said predetermined quality parameter, and defining said solder layer as an good-grade solder layer, a medium-grade solder layer, an inferior-grade solder layer or an extremely bad solder layer subject to said algorithm.

3. The circuit board assembly inspection method as claimed in claim 1, wherein using a solder paste inspector (SPI) to measure at least one geometric parameter of said solder layer and using an automated optical inspector (AOI) to measure said at least one quality parameter of said solder joint layer.

4. The circuit board assembly inspection method as claimed in claim 1, wherein using a machine to determine whether the said at least one circuit board assembly has said good-grade solder layer and said good solder joint layer, and performing a back-end process on said at least one circuit board assembly having said good-grade solder layer and said good solder joint layer.

5. The circuit board assembly inspection method as claimed in claim 1, further comprising a step of performing a defective product process to said at least one circuit board assembly having said inferior-grade solder layer and said poor solder joint layer.

6. The circuit board assembly inspection method as claimed in claim 1, further comprising a step of performing a back-end process to said at least one circuit board device having said good-grade solder layer and said poor solder joint layer.

7. The circuit board assembly inspection method as claimed in claim 1, wherein said at least one pin of each said electronic component is soldered to said circuit board by placing said at least one pin of each said electronic component on said solder layer and performing a reflow process to form said at least one circuit board assembly.

* * * * *